(12) United States Patent  
Brokaw

(10) Patent No.: US 7,646,243 B2  
(45) Date of Patent: Jan. 12, 2010

(54) CONTROLLED TRANSCONDUCTANCE DIFFERENTIAL STAGE

(75) Inventor: A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 58 days.

(21) Appl. No.: 12/220,430

(22) Filed: Jul. 23, 2008

(65) Prior Publication Data

US 2009/0027123 A1   Jan. 29, 2009

Related U.S. Application Data

(60) Provisional application No. 60/961,911, filed on Jul. 24, 2007.

(51) Int. Cl.  
*H03F 3/45* (2006.01)

(52) U.S. Cl. ........................... 330/253; 330/261

(58) Field of Classification Search .............. 330/253, 330/257, 261  
See application file for complete search history.

(56) References Cited

U.S. PATENT DOCUMENTS 5,311,145 A * 5/1994 Huijsing et al. ............ 330/255

6,265,941 B1 * 7/2001 Lopata .................... 330/258  
6,507,246 B1   1/2003 Brokaw .................. 330/288  
7,330,074 B2 * 2/2008 Kang et al. ............... 330/255

OTHER PUBLICATIONS

Analog Devices, "1.2MHz DC-DC Step-Up Switching Converter", ADP1610, Rev. 0, pp. 1-16, Oct. 2004.  
Analog Devices, "20 V, 1.2 MHz Step-Up DC-To-DC Switching Converter", ADP1611, Rev. 0, pp. 1-20, Feb. 2005.  
Analog Devices, "LCD Panel Power, $V_{COM}$, and Gate Modulation", ADD8754, Rev. 0, pp. 1-28, Apr. 2005.

* cited by examiner

*Primary Examiner*—Henry K Choe  
(74) *Attorney, Agent, or Firm*—Koppel, Patrick, Heybl & Dawson

(57) ABSTRACT

A differential stage which uses a bias generator circuit to set the operating currents of the input stage FETs to make the incremental Gm primarily a function of a single resistor embedded in the biasing circuit, such that the input stage has a Gm which only gradually departs from nominal under overdrive, and continues to supply output currents which increase with an increasing differential input signal.

15 Claims, 4 Drawing Sheets

CONTROLLED TRANSCONDUCTANCE DIFFERENTIAL STAGE

RELATED APPLICATIONS

This application claims the benefit of provisional patent application No. 60/961,911 to A. Paul Brokaw, filed Jul. 24, 2007.

BACKGROUND OF THE INVENTION

1. Field of the Invention

This invention relates generally to differential input stages for operational amplifiers, and more particularly to techniques for controlling the transconductance of the input stage transistors when the amplifier's inputs are overdriven.

2. Description of the Related Art

Differential transistor pairs used as input stages for operational amplifiers can have their incremental or small signal transconductance (Gm) defined by their tail current. However, when a differential input voltage is such that the amplifier is overdriven, the difference current output by the pair transistors is limited to the tail current, and their Gm is essentially reduced to zero for large overdrives.

An alternative input scheme is shown in FIG. 1, which includes a first high Gm stage made from FETs 10, 12, 14 and 16, and a second Gm stage made from FETs 20, 22, 24 and 26. A resistor 27 having a resistance R is connected at one end to the common sources of FETs 14 and 16, and at its other end to the common sources of FETs 24 and 26. Bias currents are provided to the input stage by a current mirror 28 which includes FETs 30 and 32, which mirror fixed currents to FETs 12 and 22, respectively.

When connected as shown, FETs 14, 16, 24 and 26 form an input stage, and FETs 10, 12, 20 and 22 set the bias current of the input stage as dictated by the bias currents delivered via FETs 30 and 32. The output currents of FETs 14, 16, 24 and 26 are delivered to an output stage (not shown), which combines them so as to cancel the operating bias and deliver differences in current among the four FETs.

Assuming current mirror FETs 30 and 32 deliver equal currents to their respective complementary pairs (FETs 10,12 and FETs 20,22, respectively), the currents in all four of FETs 14, 16, 24, 26 should be the same, and the voltage across resistance R will be zero when the difference voltage applied to the '+' and '−' inputs is zero. A non-zero difference voltage applied to the '+' and '−' inputs will be translated, approximately, to the ends of resistor 27, and the resulting current will unbalance the currents in the four FETs 14, 16, 24 and 26. These four transistor currents can be differenced to result in a net output current which is proportional to the voltage across resistance R, such that R dominates the effective small signal transconductance of the input stage.

If the input is substantially overdriven, the input stage shown will continue to deliver larger and larger currents. For example, if '−' is driven positive with respect to '+', FET 14 will continue to drive R positive, even though the input level may be high enough to effectively turn off FET 16. At the same time, FET 26 will hold the other end of resistor 27 relatively low and sink the current from R. The resulting currents delivered from the drains of FETs 14 and 26 to the output stage mentioned above will continue to increase as the differential input voltage increases. These currents may not remain strictly proportional to the differential input signal, but they will cause the differential output current to increase beyond the standing bias level.

Conventionally, FETs 14, 16, 24 and 26 are strongly biased so that their individual Gms are large, such that the effective Gm of the input stage is dominated by resistance R. However, the initial transconductance values for the two high Gm stages need to be made much higher than the effective Gm in order for resistance R to dominate and define the small signal Gm. This requires a relatively high standing bias current. Further, if resistance R is made small, the differential Gm becomes a function of the properties of the FETs making up the high Gm stages, and of the bias currents, both of which are subject to manufacturing variability.

SUMMARY OF THE INVENTION

A differential stage is presented which overcomes the problems noted above, by using a special bias generator circuit which sets the operating currents in the input stage transistors to make the incremental Gm primarily a function of a single resistor embedded in the biasing circuit. The circuit accommodates the manufacturing variability of one or both polarities of input stage transistors, so as to normalize the Gm of the stage as a primary function of the resistor value, with other variables rendered secondary. When biased in this way, the input stage has a Gm which only gradually departs from nominal under overdrive, and it continues to supply output currents which increase with an increasing differential input signal.

The differential stage includes two high Gm stages—suitably FETs, configured as shown in FIG. 1—except that the value of the resistor connected between the stages is reduced to zero, thereby reducing the standing bias current required for a given Gm and potentially increasing the achievable input stage Gm. The bias currents delivered to the input stage are provided by a bias generator circuit made from first and second transistors of like polarity, suitably FETs, having their gates connected together and a resistor having a resistance R1 connected to conduct the current in the first FET. The bias generator includes circuitry arranged to cause the said first and second bias generator FETs to operate at unequal current densities such that the resistor conducts a non-zero current, such that the transconductance of the second FET is inversely proportional to R1. A current mirror is arranged to mirror the current in the second FET to produce the first and second bias currents delivered to the input stage, such that the Gms of the input stage transistors are inversely proportional to R1.

When the input stage FETs have the same polarity and size as the second bias generator FET, their Gms can be set very accurately by selecting a particular resistance value for R1. In a preferred embodiment, the bias generator and input stage transistors are arranged such that Gms of all the input stage transistors are accurately set with R. The differential stage can be arranged such that the Gms for the input stage FETs are equal to that of the second bias generator FET; alternatively, the currents and transistor sizes can be adjusted as convenient to set the input stage Gms to be in a desired ratio with respect to that of the second bias generator FET.

These and other features, aspects, and advantages of the present invention will become better understood with reference to the following drawings, description, and claims.

DETAILED DESCRIPTION OF THE INVENTION

Figure 1:
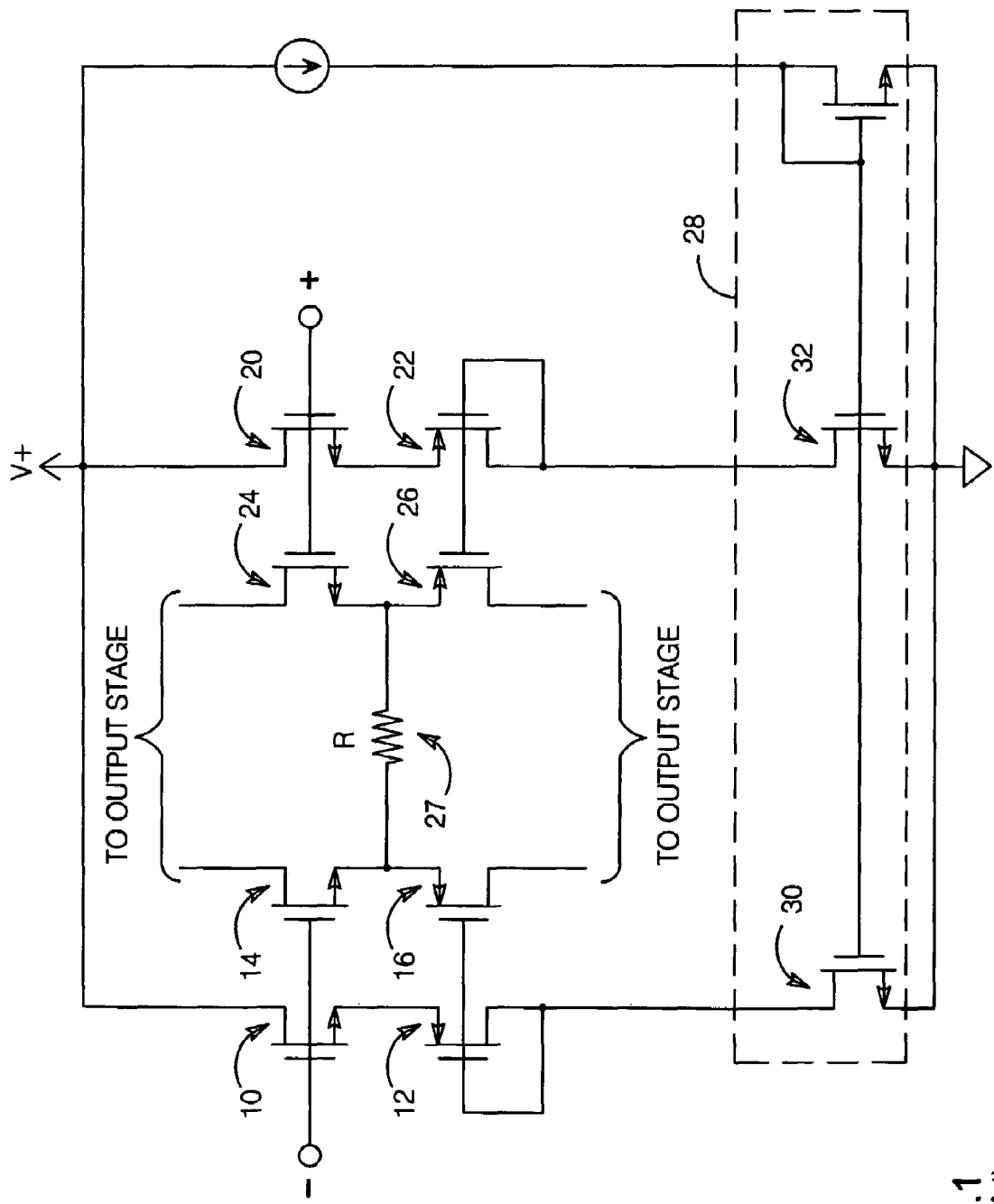
FIG. 1 is a schematic diagram of a known differential stage.

A differential stage as shown in FIG. 1 has two high Gm stages with a resistor connected between them; when strongly biased, the resistor establishes the input stage's effective small signal transconductance.

The present differential stage reduces the value of the resistor connected between the high Gm stages to zero, thereby reducing the standing bias current required to achieve a desired Gm. It also employs a bias generator circuit which sets the operating current in the input stage transistors to make the incremental Gm primarily a function of a single resistor embedded in the biasing circuit, thereby potentially increasing the achievable input stage Gm.

Figure 2:
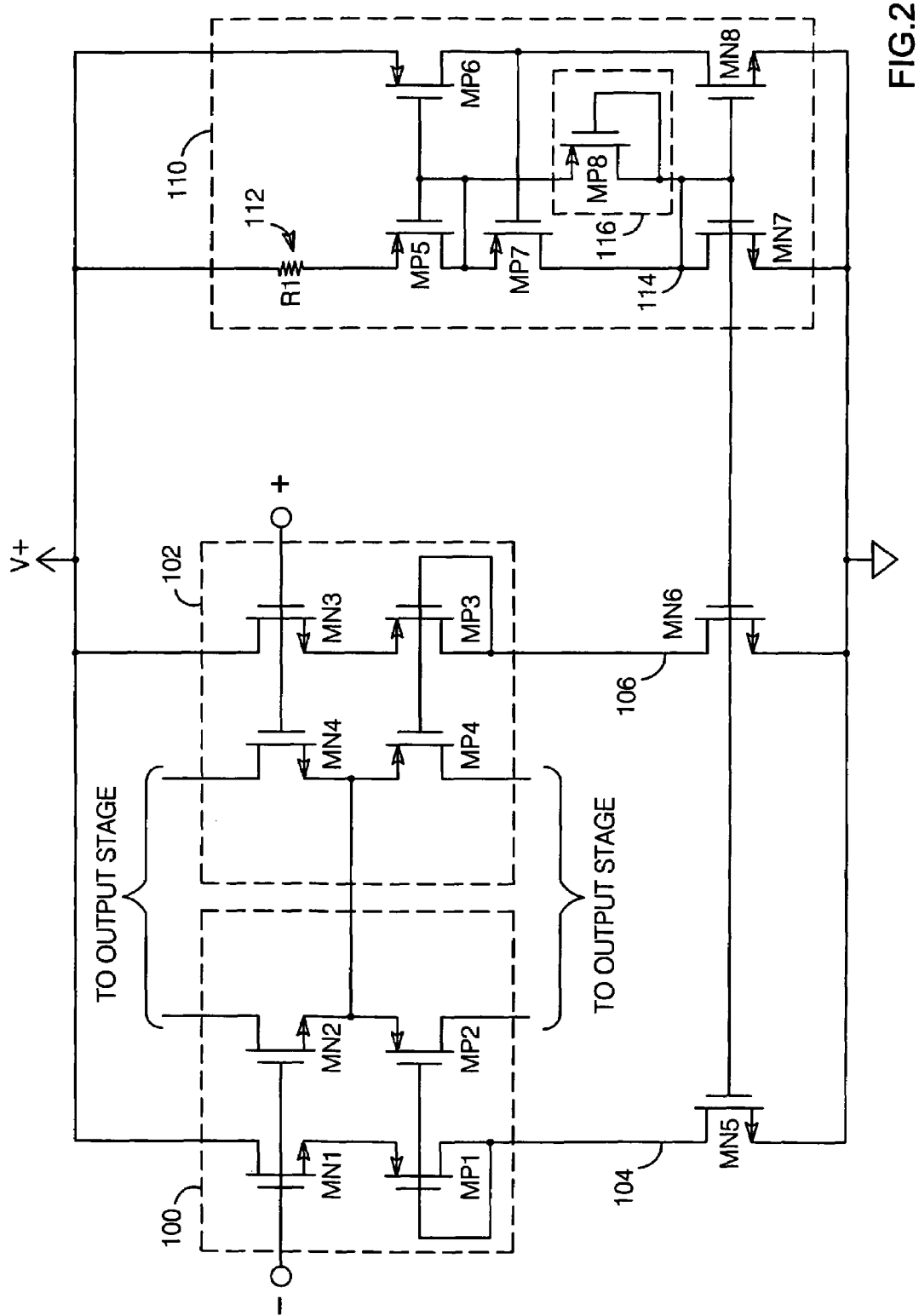
FIG. 2 is a schematic diagram of a differential stage and bias generator circuit in accordance with the present invention.

One possible embodiment of the present differential stage is shown in FIG. 2. In this example, a first high Gm stage 100 is made from FETs MN1, MN2, MP1 and MP2, and a second high Gm stage 102 made from FETs MN3, MN4, MP3 and MP4. The gates of MN1 and MN2 and the gates of MN3 and MN4 connect to differential input terminals '−' and '+', respectively. MN1 and diode-connected MP1 are series-connected between a supply voltage V+ and a node 104, and MN3 and diode-connected MP3 are series-connected between V+ and a node 106. MP2 is series-connected with MN2 with its gate connected to that of MP1, and MP4 is series-connected with MN4 with its gate connected to that of MP3. The common sources of MN2 and MP2 are connected to the common sources of MN4 and MP4. Bias currents are applied at nodes 104 and 106, via FETs MN5 and MN6, respectively.

When connected as shown, FETs MN2, MP2, MN4 and MP4 form the actual input stage, in which MN2 and MP2 work against MN4 and MP4, and FETs MN1, MP1, MN3 and MP3 set the bias current of the input stage as dictated by the bias currents delivered via FETs MN5 and MN6. As such, MN2, MP2, MN4 and MP4 are referred to herein as 'input stage' FETs, while MN1, MP1, MN3 and MP3 are referred to as 'bias' FETs. Since MN1 and MP1 are in series, they necessarily operate at the same current, which is delivered by MN5. This current forces them to adjust their $V_{gs}$ voltage to an appropriate value, such that, when the same total voltage is applied to the gates of MN2 and MP2, the current flowing through them is forced to be the same, or nearly so, as the MN5 current. The same is true for high Gm stage 102, where MN3, MN4, MP3 and MP4 should all run at the MN6 current. In this way, the MN5 current provided to bias FETs MN1 and MP1 establishes the operating current for input stage FETs MN2 and MP2; similarly, the MN6 current establishes the operating current for input stage FETs MN4 and MP4.

The output currents of input stage FETs MN2, MP2, MN4 and MP4 are delivered to an output stage (not shown), which combines them so as to cancel the operating bias and deliver differences in current among the four FETs. In use, when the differential voltage is non-zero, the high Gm stage on one side injects current into the common source node of the high Gm stage on the other side, so the top and bottom input stage FETs (e.g. MN4, MP4) no longer share the same current, and a difference current can be obtained from their drains. Since the current coming from one high Gm stage to unbalance the other must be made by becoming unbalanced in exactly the same way, there are two differential currents available.

As noted above, the present differential stage reduces the value of the resistor connected between the common source nodes of high Gm stages 100 and 102 to zero. This reduces the standing bias, and also eliminates the role this resistor played in determining the Gm of the differential stage. For the present differential stage, the Gms of high Gm stages 100 and 102 are established with a bias generator circuit such as circuit 110 shown in FIG. 2. A resistor 112 having a resistance R1 is connected between the source of a PMOS FET MP5 and supply voltage V+, which is also connected to the source of a PMOS FET MP6; MP5 is diode-connected, and the gates of MP5 and MP6 are connected together. Thus, MP5 and MP6 have a common gate voltage, but their source voltages differ by an amount that depends on the current ($I_{R1}$) in resistor 112.

As explained below, bias generator circuit 110 is arranged such that MP5 and MP6 operate at unequal current densities to ensure a non-zero $I_{R1}$ current.

A PMOS FET MP7 is connected between the drain of MP5 and a node 114, as is a startup current device 116. A current mirror is formed by a diode-connected NMOS FET MN7 and NMOS FET MN8, which mirrors current from node 114 to the drain of MP6 and the gate of MP7. MP7 operates to buffer the drains of MP5 and MP6 from supply voltage variation. Startup current device 116 is a two-terminal device or circuit capable of reliably drawing a small, but non-zero current. As shown in FIG. 2, one possible startup current device implementation is a diode-connected PMOS FET MP8. MP8 is preferably a long channel device which ensures that the current in the left branch of circuit 110 cannot be zero, to insure starting, but without drawing a current in excess of the desired bias current for any applied supply voltage.

In use, drain current from MP5 is delivered to the current mirror (MN7, MN8) by the combination of MP7 and MP8. This total current is mirrored back to MP6 and the gate of MP7, which is connected to force MP6 to accept the current.

Bias generator circuit 110 is arranged such that MP5 and MP6 operate at unequal current densities such that the $V_{gs}$ of MP5 is smaller than that of MP6—thereby ensuring a non-zero $I_{R1}$ current. One way in which this can be achieved is by making MP5 larger than MP6, and then operating MP5 and MP6 at equal currents. For example, when MP5 is larger than MP6 and MN7 and MN8—preferably long channel devices—are matched, the equilibrium condition for bias generator circuit 110 is when MP5 and MP6 operate at equal currents.

Note that, as explained below, it is not essential that MP5 and MP6 be operated at equal currents. However, the analysis below assumes equal currents in MP5 and MP6; these equal currents are referred to below as 'I' (which is equal to $I_{R1}$). Using the simple approximation that for either MP5 or MP6 the drain current, $I_D$, will be given by:

$I_D = 0.5\beta(V_{gs}-V_{tp})^2$, where $\beta$ represents the FET's beta factor $\mu C_{ox} W/L$ and $V_{tp}$ is its threshold voltage, it follows that:

$$V_{gs} - V_{tp} = \sqrt{\frac{2I_D}{\beta}}.$$

And by differentiation:

$$Gm = \frac{dI_D}{dV_{gs}} = \beta(V_{gs} - V_{tp}) \text{ or } Gm = \beta\sqrt{\frac{2I_D}{\beta}} = \sqrt{2I_D\beta}.$$

By inspection:

$V_{gs,MP6} = V_{gs,MP5} + (I*R1)$, and assuming $V_{tp}$ is the threshold voltage of both MP5 and MP6:

$V_{gs,MP6} - V_{tp} = (V_{gs,MP5} - V_{tp}) + (I*R1)$, so:

$I*R1 = (V_{gs,MP6} - V_{tp}) - (V_{gs,MP5} - V_{tp})$, and since $I_D$ for both MP5 and MP6 devices is I, by substitution:

$$I*R1 = \sqrt{\frac{2I}{\beta_{MP6}}} - \sqrt{\frac{2I}{\beta_{MP5}}}$$

Multiplying by $\sqrt{\frac{\beta_{MP6}}{2I}}$:

$$(I*R1)\sqrt{\frac{\beta_{MP6}}{2I}} = 1 - \sqrt{\frac{\beta_{MP6}}{\beta_{MP5}}}$$

and since:

$$\left(\frac{2}{2}\right)(I*R1)\sqrt{\frac{\beta_{MP6}}{2I}} = \left(\frac{R1}{2}\right)\sqrt{\beta_{MP6}2I}, \text{ and } Gm_{MP6} = \sqrt{\beta_{MP6}2I},$$

we can substitute:

$$\left(\frac{R1}{2}\right)Gm_{MP6} = 1 - \sqrt{\frac{\beta_{MP6}}{\beta_{MP5}}}.$$

Solving for $Gm_{MP6}$:

$$Gm_{MP6} = 2\left(\frac{1 - \sqrt{\frac{\beta_{MP6}}{\beta_{MP5}}}}{R1}\right)$$

It will be convenient, though not necessary, to set $\beta_{MP5} = 4\beta_{MP6}$ by making $W_{MP5} = 4W_{MP6}$ with $L_{MP5} = L_{MP6}$. In this case:

$$Gm_{MP6} = 2\left(\frac{\sqrt{\frac{1}{4}}}{R1}\right) = \frac{1}{R1}.$$

As such, if another PMOS FET having the same β as MP6 is operated at current I, it will also have a Gm of 1/R1. Current I is available in the MN7, MN8 current mirror, and is thus mirrored to high Gm stages 100 and 102 via MN5 and MN6. Therefore, the Gms of FETs MN1-MN4 and MP1-MP4 will be inversely proportional to R1, or equal to 1/R1 if of like polarity and with the same β as MP6. Here, then, sizing MP1-MP4 to have the same β as MP6 results in their Gm values to be equal to 1/R1. MN1-MN4 are likely to have different β values than MP1-MP4; as such, though their Gm values will be known and controlled, they will be proportional, rather than equal, to 1/R1.

As noted above, it is not essential that MP5 and MP6 be operated at equal currents. In the equal currents example above, when $\beta_{MP5} = 4\beta_{MP6}$, $Gm_{MP6} = 1/R1$. However, MP5 and MP6 could be made the same size, with the MN7/MN8 current mirror unbalanced so that MN7 conducts one-fourth of the MN8 current. Now, MN5 will again run at one-fourth the current density of MP6, but with a smaller current. MP6 operates at the same current and current density as before, and thus has the same Gm as it had when the currents in MP5 and MP6 were equal. In general, if the sizes of MP5 and MP6 and their respective currents are sized so as to preserve the current density difference present for when MP5 and MP6 currents are equal, the Gm of MP6 will remain proportional to 1/R1.

In the equal currents example above, $\beta_{MP5}$ was set equal to $4\beta_{MP6}$. It is not essential that $\beta_{MP5} = 4\beta_{MP6}$; however, the ratio must be larger than one to avoid reducing $Gm_{MP6}$ to zero.

Note that an opposite polarity version of the bias generator circuit of FIG. 2 could be implemented such that the Gm of an NMOS FET is made equal to 1/R1. In this case, sizing MN1-MN4 to have the same β as the bias generator's NMOS FET would make their Gm values equal to 1/R1.

Note that it is not essential that the input stage FETs operate at exactly the same current as does MP6. Making these currents equal is a convenient way to operate, but is not strictly necessary, as current and size ratios resulting in unequal currents can be used to control the input stage Gm. For example, making MN5 and MN6 four times wider than MN8 would quadruple the input stage bias current (assuming all other conditions are unchanged), and since Gm is proportional to the square root of the bias current, the Gm would double. Another possibility would be to leave the MN5 and MN6 currents the same (or even reduce them with respect to MP6), but make input stage FETs MN2, MP2, MN4, and MP4 all, for example, 2× bigger. This would double the currents in the input stage as well as increasing their width, so doing this would also double the overall Gm—without increasing the operating currents of the biasing transistors. Many other possibilities of this sort are possible; however, in all cases, the Gm can be made to stay in some desired ratio to that of MP6, the Gm of which can be set by values of R1.

Figure 3:
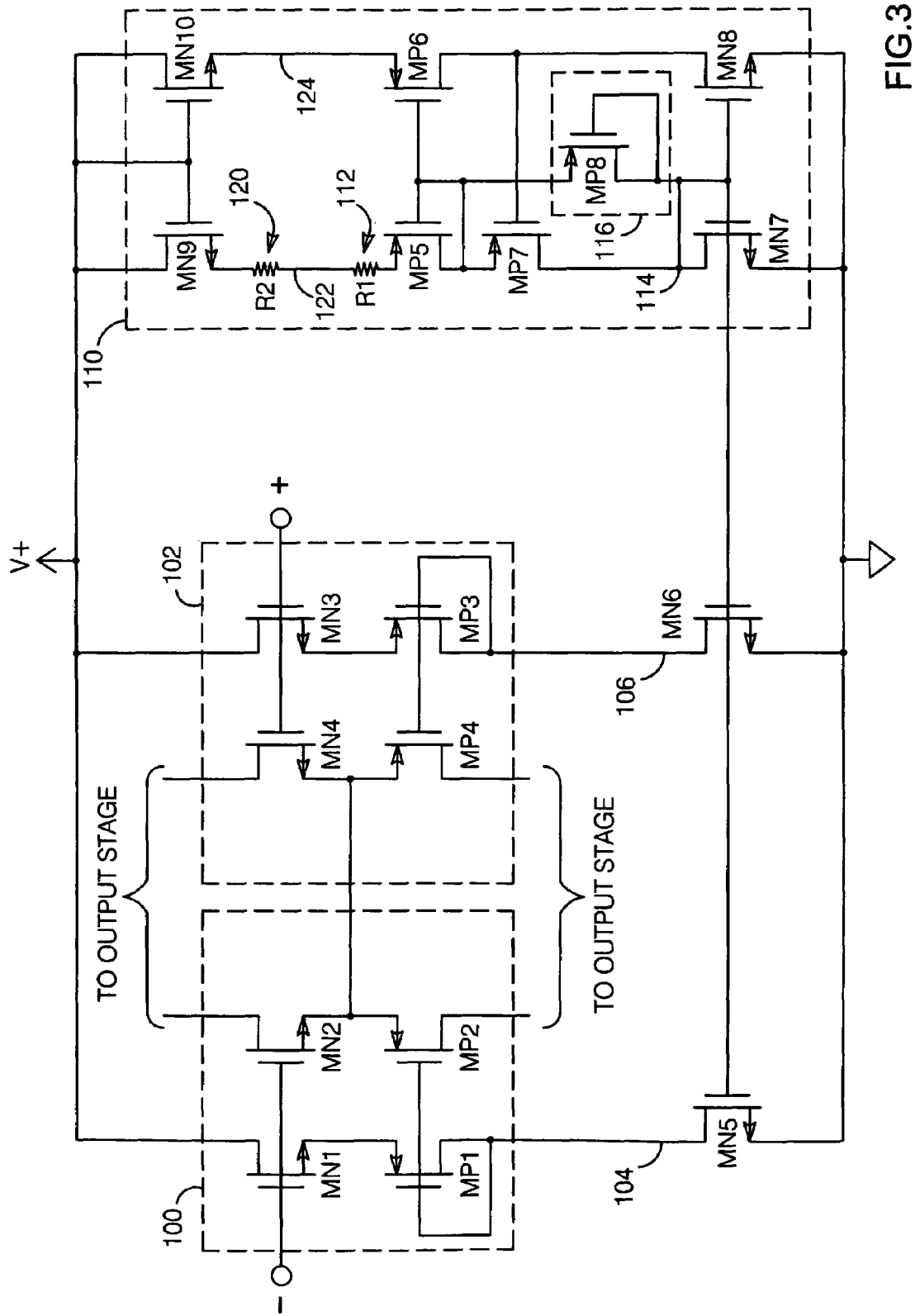
FIG. 3 is a schematic diagram of another possible embodiment of a differential stage and bias generator circuit in accordance with the present invention.

Another possible embodiment of the present differential stage is shown in FIG. 3. Here, bias generator 110 includes a pair of NMOS FETs MN9, MN10 stacked on top of PMOS FETs MP5 and MP6. MP7 and MP8 operate as in FIG. 2, and the bias generator again reaches equilibrium when the currents in both sides are equal—i.e., with equal currents in MP5 and MP6, and in MN9 and MN10. However, the current density will not necessarily be the same current density as in the FIG. 2 embodiment, because of the introduction of MN9 and MN10.

Resistor R1 continues to be connected in series with the source of MP5, and a resistor 120 having a resistance R2 is connected in series with the source of MN9; the resistors are connected together at a node 122. As with MP5 and MP6, MN9 and MN10 are sized to ensure that a non-zero current flows in R2; thus, at equal currents, the source of MN9 must be more positive than the voltage at node 124, and the source of MP5 must be below the node 124 voltage. As such, the resistances of one or both of resistors 112, 120 can be adjusted so that, at the equilibrium current density, the voltages at nodes 122 and 124 are equal. When this is done, the conditions for MP5 and MP6 are the same as they were in FIG. 2, and so the Gm of MP6 must be 1/R1. A similar argument for MN9 and MN10 concludes that the Gm of MN10 must equal 1/R2.

Thus, the addition of MN9, MN10 and R2 enable the Gms of bias FETs MN1 and MN3, and thereby input stage FETs MN2 and MN4, to be accurately set with R2, assuming all have the same β as MN10.

When so arranged, the net Gm for signals driving the gates of the input stage's PMOS and NMOS FETs differentially will be:

$$Gm_{net} = \frac{1}{(1/Gm_{MP6} + 1/Gm_{MN10})} = \frac{1}{R1 + R2}.$$

So, the net Gm is simply equal to the reciprocal of the total resistance R1+R2.

Note that it is not the top to bottom gate voltage difference that is driven, but rather the side to side gate voltages. The effective Gm then is just:

$$Gm_{eff} = \frac{1}{R2||R1}, \text{ or } \frac{R2 + R1}{R2 * R1},$$

which can be rewritten as:

$$\frac{1 + R1/R2}{R1},$$

which becomes:

$$Gm_{MP6}\left(1 + \frac{Gm_{MN10}}{Gm_{MP6}}\right).$$

If the Gms are equal, this is 2Gm, and if they depart, slightly, from equality, the resultant is not very sensitive.

If MP5, MP6, MN9 and MN10 are sized such that when R2=R1, the voltages at nodes 122 and 124 are equal, the result is that the effective Gm for each side of the input stage is $$Gm_{eff} = \frac{1}{2R2}.$$

Because the NMOS and PMOS Gms act in parallel, they should be fairly robust in manufacture and over temperature.

Note that the Gms of MN10 and MP6 taken together set the Gm of the two sides of the input stage (MN2, MP2) and (MN4, MP4), and so R1 and R2 (and thereby the PMOS Gms and the NMOS Gms) are not required to be equal. That is, the bias generator of FIG. 3 can be used to set the NMOS and PMOS Gms to some desired ratio, or to equality. However, it is convenient to make R1=R2, as this makes the FETs which contribute to the overall Gm all have the same individual Gm, and this is the general condition for the most robust behavior against manufacturing variations in the NMOS and PMOS beta ratios. To achieve this condition, R1 and R2 are made equal, and the ratio of the sizes of the bias generator's NMOS FETs MN9 and MN10 with respect to its PMOS FETs MP5 and MP6 (while keeping the size ratios of MP5 to MP6 and MN9 to MN10 fixed) is adjusted to make the voltage at nodes 122 and 124 equal, thereby setting the NMOS Gm=PMOS Gm=1/R1=1/R2.

Note that once the above steps have been taken, MN9, MN10 and R2 need not be retained. With the sizes of MN9 and MN10 needed to set the NMOS Gm=1/R1 known, NMOS FETs MN1-MN4 can be sized accordingly, and nodes 122 and 124 can be shorted together and to V+ with little to no change in current and Gm. Alternatively, the differential stage can be implemented as shown in FIG. 2, but only after using the bias generator of FIG. 3 as a design aid, to determine the proper sizes for R1 and FETs MN1-MN4 and MP1-MP4 of the FIG. 2 implementation.

Figure 4:
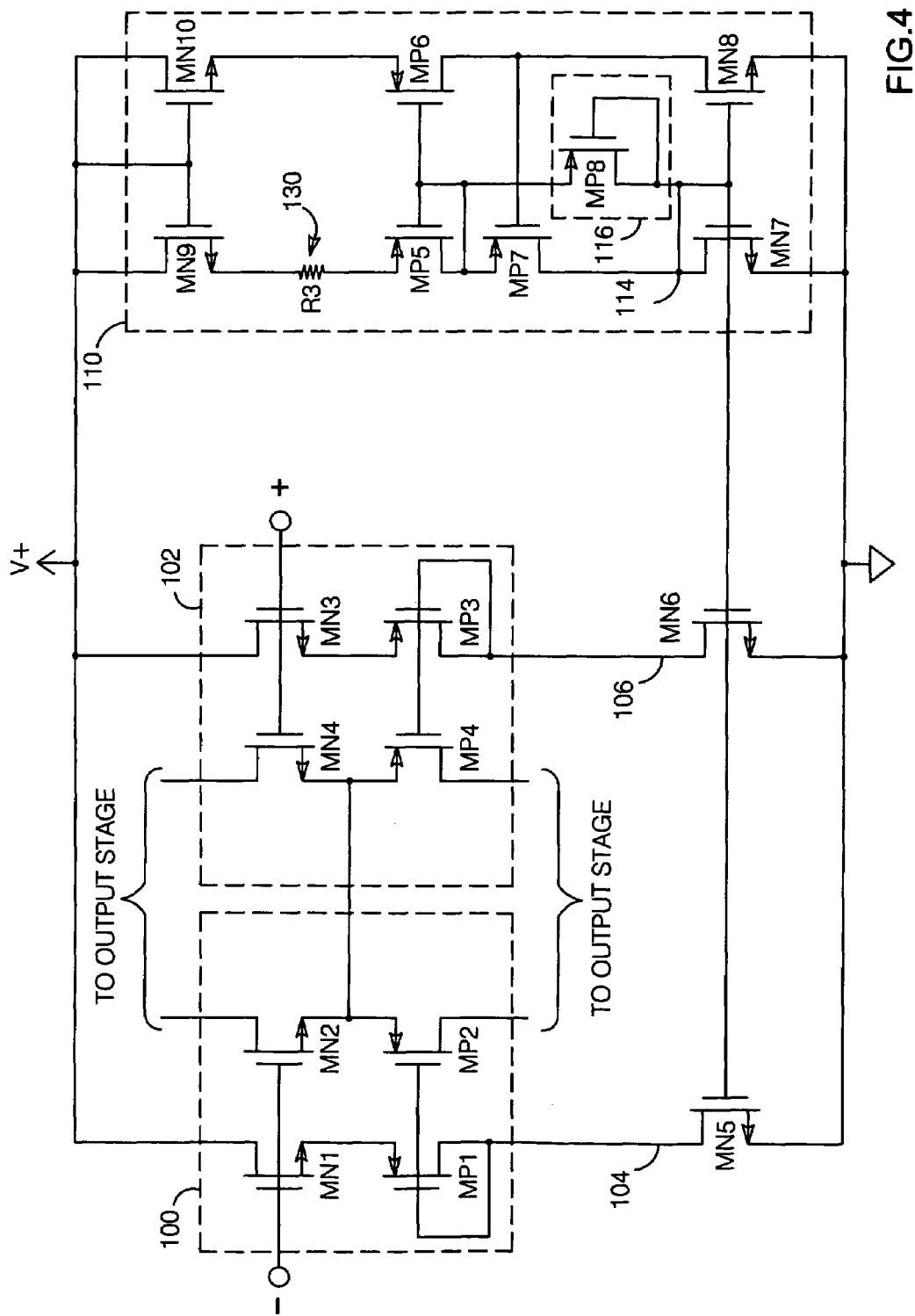
FIG. 4 is a schematic diagram of another possible embodiment of a differential stage and bias generator circuit in accordance with the present invention.

An advantage to using the bias generator of FIG. 3 is that the larger total resistance (R1+R2) improves the ballasting to help reduce the effect of temperature and process variation. If a bias generator as shown in FIG. 3 is to be used, once the necessary transistor and resistor sizes are known, resistors 112 and 120 can be combined into a single resistor 130 as shown in FIG. 4, having a resistance R3 given by R1+R2.

The use of a bias generator as described above serves to accommodate the manufacturing variability of one or both polarities of input stage transistors, so as to normalize the Gm of the stage as a primary function of the bias generator's resistor value, with other variables rendered secondary. When biased in this way, the input stage has a Gm which only gradually departs from nominal under overdrive, and it continues to supply output currents which increase with an increasing differential input signal.

Note that embodiments similar to those described herein, but using opposite polarity active devices, are also contemplated.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A controlled transconductance differential input stage, comprising:
   a differential input stage, comprising:
      inverting and non-inverting input nodes;
      first and second complementary input stage field-effect transistors (FETs) (MN2,MP2) series-connected at a first node, the gate of said first input stage FET connected to said inverting node;
      first and second series-connected bias FETs (MN1, MP1) having the same polarities as said first and second input stage FETs, respectively, and arranged to conduct a first bias current, the gates of said first and second bias FETs connected to the gates of said first and second input stage FETs, respectively, such that the transconductances of said first and second input stage FETs vary with said first bias current;
      third and fourth complementary input stage FETs (MN4,MP4) series-connected at a second node, the gate of said third input stage FET connected to said non-inverting node; and
      third and fourth series-connected bias FETs (MN3, MP3) having the same polarities as said third and fourth input stage FETs, respectively, and arranged to conduct a second bias current, the gates of said third and fourth bias FETs connected to the gates of said third and fourth input stage FETs, respectively, such that the transconductances of said third and fourth input stage FETs vary with said second bias current;
      said first node connected to said second node; and
   a bias generator circuit, comprising:

first and second bias generator FETs of like polarity and having their gates connected together;

a first resistor having a resistance R1 connected between a supply voltage and the source of said first bias generator FET;

the drain of said first bias generator FET connected to a third node, said first bias generator FET being diode-connected;

the source and drain of said second bias generator FET connected to said supply voltage and a fourth node, respectively;

circuitry arranged to cause said first and second bias generator FETs to operate at unequal current densities such that said first resistor conducts a non-zero current, such that the transconductance of said second bias generator FET is inversely proportional to R1; and a current mirror arranged to mirror the current in said second bias generator FET to provide said first and second bias currents, such that the transconductances of said input stage FETs are inversely proportional to R1.

2. The differential input stage of claim 1, wherein said bias generator circuit is arranged such that the transconductance of said second bias generator FET is given by 1/R1.

3. The differential input stage of claim 1, wherein the beta factors of said second bias generator FET and the bias FETs having the same polarity as said second bias generator FET are substantially equal.

4. The differential input stage of claim 1, said stage arranged such that said first and second bias currents and the current in said second bias generator FET are substantially equal.

5. The differential input stage of claim 1, said stage arranged such that said first and second bias currents are proportional to the current in said second bias generator FET.

6. The differential input stage of claim 1, said bias generator circuit arranged such that:

said first and second bias generator FETs are PMOS FETs;

said circuitry comprising:

a PMOS FET having its source and drain connected between said third node and the input of said current mirror and its gate connected to said fourth node; and a startup current device connected between said third node and the input of said current mirror, said device arranged to conduct a non-zero current to ensure the startup of said bias generator circuit;

said current mirror arranged to mirror the current received at its input to said fourth node.

7. The differential input stage of claim 6, wherein two of said input stage FETs and two of said bias FETs are PMOS FETs, each of which is arranged to have a beta factor which is approximately equal to that of said second bias generator FET.

8. The differential input stage of claim 7, wherein said bias generator circuit is arranged such that the transconductance of said second bias generator FET, said PMOS input stage FETs, and said PMOS bias FETs is given by 1/R1.

9. The differential input stage of claim 6, wherein said start up current device comprises a diode-connected MOSFET having its source and drain connected between said third node and the input of said current mirror, respectively.

10. The differential input stage of claim 1, wherein said bias generator circuit is arranged such that the currents in said first and second bias generator FETs are substantially equal.

11. The differential input stage of claim 1, wherein said bias generator circuit is arranged such that the currents in said first and second bias generator FETs are substantially different.

12. The differential input stage of claim 1, wherein the transconductance of said second bias generator FET is equal to a desired value when the sizes of said first and second bias generator FETs and R1 result in a given current density ratio between said first and second bias generator FETs, said bias generator circuit arranged such that the transconductance of said second bias generator FET remains inversely proportional to R1 and equal to said desired value for different sizes of said first and second bias generator FETs and R1 as long as said given current density ratio between said first and second bias generator FETs is preserved.

13. The differential input stage of claim 1, wherein said second and fourth bias FETs are diode-connected.

14. The differential input stage of claim 1, wherein the sizes of said bias FETs are scaled with respect to said input stage FETs to achieve desired operating currents and/or transconductance values for said input stage FETs.

15. The differential input stage of claim 1, wherein the sizes of said bias FETs and/or said input stage FETs are scaled with respect to said second bias generator FET to achieve desired operating currents and/or transconductance values for said input stage FETs.

* * * * *